US012453020B2

(12) United States Patent
Lu et al.

(10) Patent No.: US 12,453,020 B2
(45) Date of Patent: Oct. 21, 2025

(54) ELECTRONIC CONTROL DEVICE CASE

(71) Applicant: Panasonic Energy Co., Ltd., Osaka (JP)

(72) Inventors: Jia Lu, Osaka (JP); Takuo Nakamura, Osaka (JP); Takuya Yamane, Osaka (JP)

(73) Assignee: PANASONIC ENERGY CO., LTD., Osaka (JP)

( * ) Notice: Subject to any disclaimer, the term of this patent is extended or adjusted under 35 U.S.C. 154(b) by 234 days.

(21) Appl. No.: 18/547,522

(22) PCT Filed: Feb. 25, 2022

(86) PCT No.: PCT/JP2022/008068
§ 371 (c)(1),
(2) Date: Aug. 23, 2023

(87) PCT Pub. No.: WO2022/186091
PCT Pub. Date: Sep. 9, 2022

(65) Prior Publication Data
US 2024/0138079 A1  Apr. 25, 2024
US 2024/0237236 A9  Jul. 11, 2024

(30) Foreign Application Priority Data

Mar. 3, 2021 (JP) .................................. 2021-033417

(51) Int. Cl.
*H05K 5/02* (2006.01)
*H01M 50/204* (2021.01)
(Continued)

(52) U.S. Cl.
CPC ........ *H05K 5/0208* (2013.01); *H01M 50/204* (2021.01); *H01M 50/224* (2021.01);
(Continued)

(58) Field of Classification Search
CPC ....................................................... G06F 1/187
See application file for complete search history.

(56) References Cited

U.S. PATENT DOCUMENTS

2012/0100399 A1* 4/2012 Adachi ................ H01M 10/46
429/7
2013/0032685 A1* 2/2013 Liu ........................ G06F 1/187
248/310

FOREIGN PATENT DOCUMENTS

JP          05-082084 U      11/1993
JP          2000-228586       8/2000
(Continued)

OTHER PUBLICATIONS

International Search Report of PCT application No. PCT/JP2022/008068 dated Apr. 12, 2022.

*Primary Examiner* — Jerry Wu
(74) *Attorney, Agent, or Firm* — WHDA, LLP

(57) ABSTRACT

An electronic control device case prevents a gap provided therein. The electronic control device case includes: a body case including a bottom plate and a pair of side walls bent at and extended from both ends of the bottom plate and having a front opening; and a cover including a front plate closing the front opening of the body case. The body case includes a first flange bent at a front end of the bottom plate, and second flanges bent at respective front ends of the pair of side walls. The first flange is positioned on a first plane. The second flanges are positioned on a second plane different from the first plane. The first flange pushes a back surface at a lower edge of the front plate of the cover. The second flanges push front surfaces at both side ends of the front plate of the cover. In this configuration, the edge of the front plate of the cover is sandwiched and held between the first flange and each second flange.

10 Claims, 14 Drawing Sheets

(51) Int. Cl.
*H01M 50/224* (2021.01)
*H01M 50/271* (2021.01)
*H05K 5/03* (2006.01)
*H05K 5/04* (2006.01)

(52) U.S. Cl.
CPC ............ *H01M 50/271* (2021.01); *H05K 5/03* (2013.01); *H05K 5/04* (2013.01)

(56) References Cited

FOREIGN PATENT DOCUMENTS

| | | |
|---|---|---|
| JP | 2000-307259 | 11/2000 |
| JP | 2015-053276 | 3/2015 |
| JP | 2019-075497 | 5/2019 |
| JP | 2019-110709 | 7/2019 |

* cited by examiner

ELECTRONIC CONTROL DEVICE CASE

CROSS-REFERENCE TO RELATED APPLICATIONS

This application is a U.S. national stage application of the PCT International Application No. PCT/JP2022/008068 filed on Feb. 25, 2022, which claims the benefit of foreign priority of Japanese patent application No. 2021-033417 filed on Mar. 3, 2021, the contents all of which are incorporated herein by reference.

TECHNICAL FIELD

The present invention relates to an electronic control device case.

BACKGROUND ART

Electronic control devices, such as charging/discharging control circuits or protecting circuits for power source devices, including batteries may be accommodated in metal cases. Such electronic control device cases may be made of metal plates. In electronic control device case 900 shown in FIG. 16, ends of body case 910 are bent to form flanges, and cover 920 with an L-shape is fixed to the flanges with screws.

In this configuration, a gap may be formed at each corner of the flanges of body case 910, as shown in an enlarged perspective view of FIG. 19. Foreign matters, such as dusts, may enter into the inside of electronic control device case 900 and cause an unintentional failure, such as short-circuits.

Particularly, as a conventional manner considering the influence of the spring back occurring at the time of bending the metal plate, it is necessary to form the shape of the case so as to have extra gaps between the flanges to prevent the flanges from interfering with each other. As a result, large gaps are caused at the corners. To reduce the size of each gap to be within an allowable range, it was necessary to fill the gaps with a resin component or a cushion material.

CITATION LIST

Patent Literature

PTL 1: Japanese Patent Laid-Open Publication No. 2015-53276

SUMMARY

Problem to be Solved

An object of the present invention is to provide an electronic control device case preventing a gaps from being provided therein.

Solution to Problem and Advantageous Effect

To attain the above-mentioned object, an electronic control device case in accordance with a first aspect of the present invention includes: a body case including a bottom plate and a pair of side walls which are bent at both ends of the bottom plate and extend from the both ends of the bottom plate, respectively, the body case having a front opening; and a cover including a front plate closing the front opening of the body case. The body case further includes a first flange bent and second flanges, the first flange being bent at a front end of the bottom plate, the second flanges being bent at respective front ends of the pair of side walls. The first flange is positioned on a first plane, and the second flanges are positioned on a second plane different from the first plane. The first flange pushes a lower end of a back surface of the front plate of the cover. The second flanges push both side ends of a front surface of the front plate of the cover. In the above configuration, the end of the front plate of the cover is sandwiched and held between the first flange and each of the second flanges.

In an electronic control device case in accordance with a second aspect of the present invention, in the first aspect, the second plane on which the second flanges are positioned is located outer than the first plane.

In an electronic control device case in accordance with a third aspect of the present invention, in the first or second aspect, the first flange has oblique surfaces at both side edges thereof close to the second flanges, and each of the second flanges has an oblique surface at a lower edge of the each of the second flanges close to the first flange.

In an electronic control device case in accordance with a fourth aspect of the present invention, in any one of the first to third aspects, each of the oblique surface of the first flange and the oblique surfaces of the second flanges incline at an angle of 45°.

In an electronic control device case in accordance with a fifth aspect of the present invention, in any one of the first to fourth aspects, the first flange does not overlap the second flanges when viewed from front.

In an electronic control device case in accordance with a sixth aspect of the present invention, in any one of the first to fifth aspects, the first flange is bent at the lower end of the front plate in a direction away from the front plate. In this configuration, the bent end of the first flange forms an insertion guide to the gap between the first flange and each of the second flanges, enhancing convenience for the work of assembling the electronic control device case.

In an electronic control device case in accordance with a seventh aspect of the present invention, in any one of the first to sixth aspects, the first flange and the second flanges have a same width.

In an electronic control device case in accordance with an eighth aspect of the present invention, in any one of the first to seventh aspects, the body case further includes a back plate closing a back opening demarcated by a back end of the bottom plate and respective back ends of the pair of side walls. The cover further includes a top plate bent at an upper end of the front plate and extending from the upper end of the front plate such that the top plate closes an upper opening demarcated by respective upper ends of the pair of side walls and an upper end of the back plate of the body case.

In an electronic control device case in accordance with a ninth aspect of the present invention, in any one of the first to eighth aspects, the front plate has no opening for screwing.

In an electronic control device case in accordance with a tenth aspect of the present invention, in any one of the first to ninth aspects, the body case and the cover are made of metal plates.

In an electronic control device case in accordance with an eleventh aspect of the present invention, in any one of the first to tenth aspects, the electronic control device case accommodates therein a control circuit for a power source device including a plurality of secondary battery cells.

DESCRIPTION OF EMBODIMENTS

Hereinafter, exemplary embodiments of the present invention will be described with reference to the drawings. In this regard, however, it should be noted that the exemplary embodiment described hereinafter are merely examples embodying the technical ideas of the present invention and that the present invention is not limited to the described exemplary embodiments. Further, the present specification is not intended to limit the elements recited in the claims to the members shown in the exemplary embodiments. Particularly, the dimensions, materials, shapes, relative positions, and the like of the structural components described in the exemplary embodiments are merely examples and are not intended to limit the scope of the present invention solely to them unless otherwise specifically described to do so. The sizes, positional relations, and the like of the members shown in each figure may sometimes be exaggerated to clarify the explanation. Further, in the following description, like names or like reference marks indicate like or identical members, and duplicate detailed explanation on them will appropriately be omitted. Further, each of the components constituting the present invention may be, in one aspect, such that plural components are configured using a same member to use a single member commonly as plural components, or may be, in another aspect on the contrary, such that plural members share implementation of one function of one member.

An electronic control device case according to the present invention may be used as an outer case accommodating therein a circuit for controlling and monitoring a power source device which includes secondary battery cells connected in series or in parallel or in a combination of series and parallel to one another. The electronic control device case according to the present invention may also be used as an outer case of a power supply device accommodating secondary battery cells therein. The electronic control device case according to the present invention may also be used as a case accommodating therein an electronic circuit, such as another control circuit or a protecting circuit. The power supply device may be used for various purposes including, for example, a backup power source for a server, a power source equipped in an electric-powered vehicle such as a hybrid vehicle and an electric vehicle to supply power to a driving motor, a power source for storing natural energy power generated by the solar power generation or the wind-powered electricity generation, a power source for storing the midnight electric power, and a storage power source for the power load leveling during peak electricity hours. Hereinafter, as an electronic control device case according to an exemplary embodiment of the present invention, an example of housing case for housing a control circuit that is placed with a power supply device to control the power supply device.

Exemplary Embodiment 1

Figure 1:
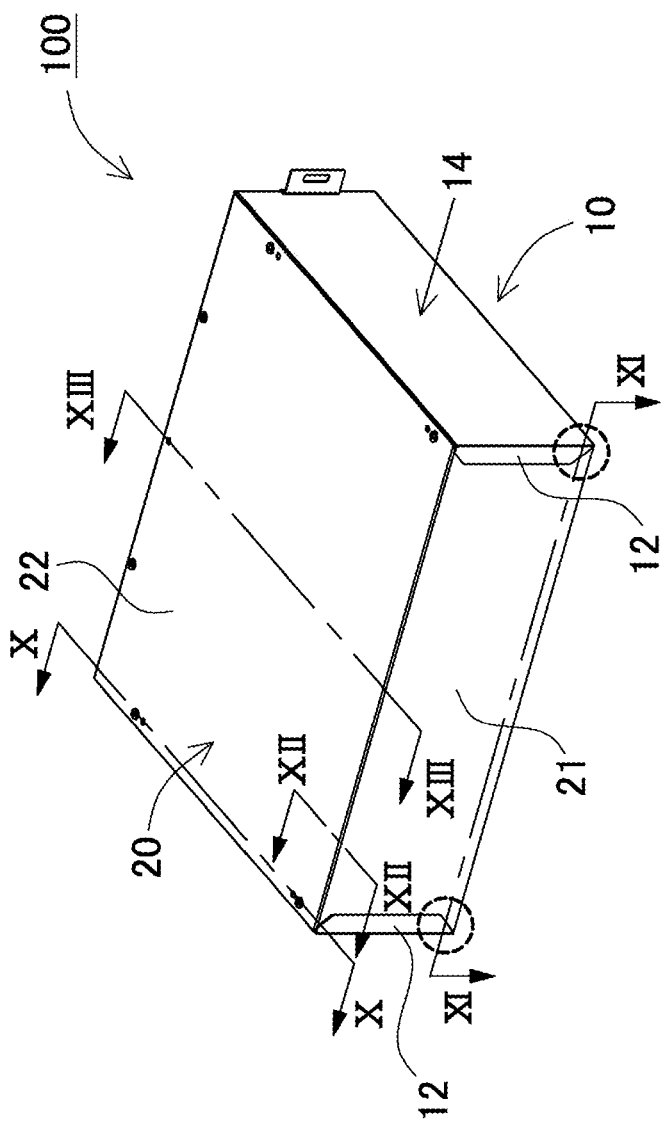
FIG. 1 is a perspective view of an electronic control device case according to Exemplary Embodiment 1 of the present invention.
Figure 2:
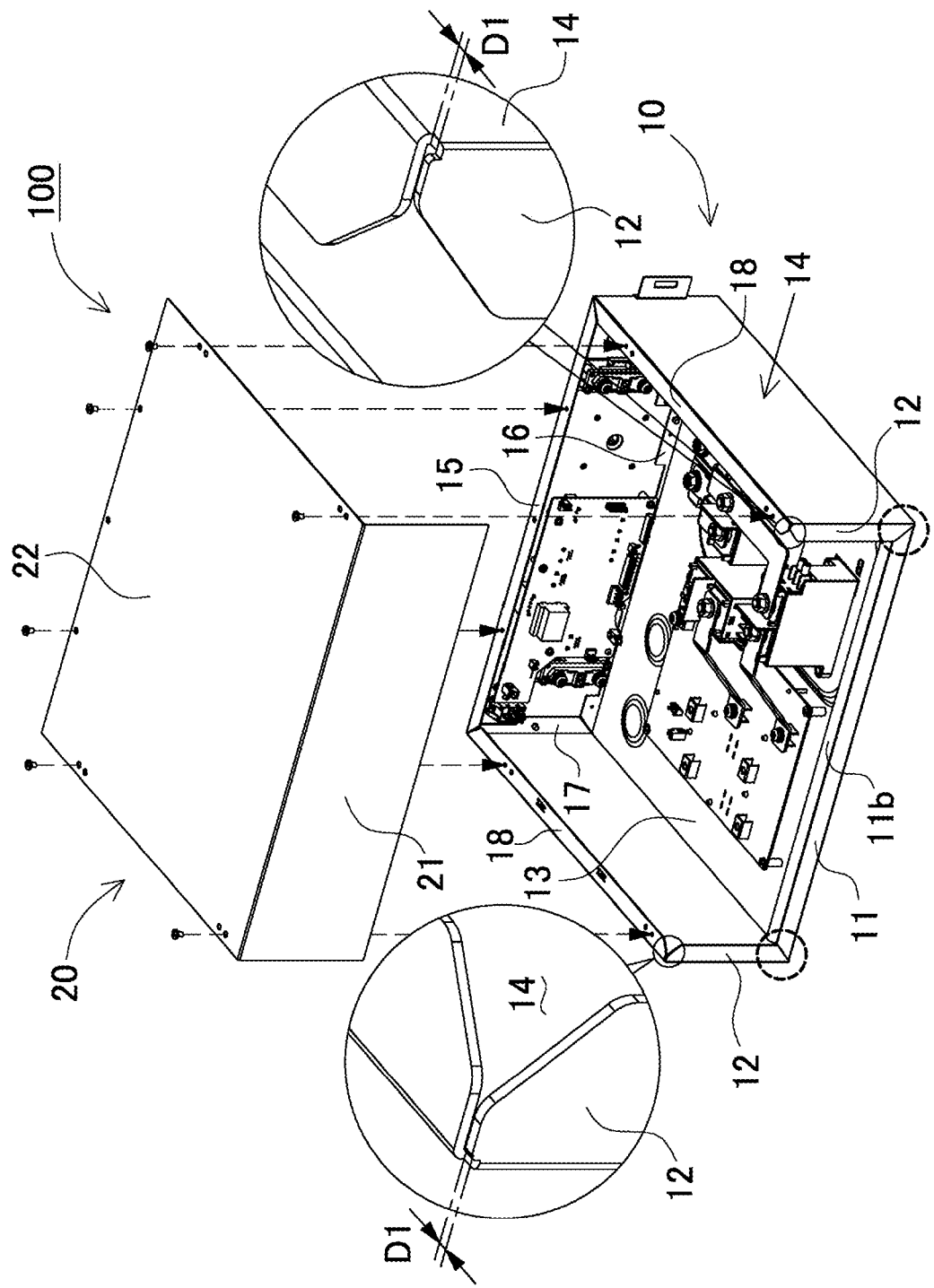
FIG. 2 is an exploded perspective view of the electronic control device case shown in FIG. 1 including an enlarged view of a main part of the electronic control device case.
Figure 3:
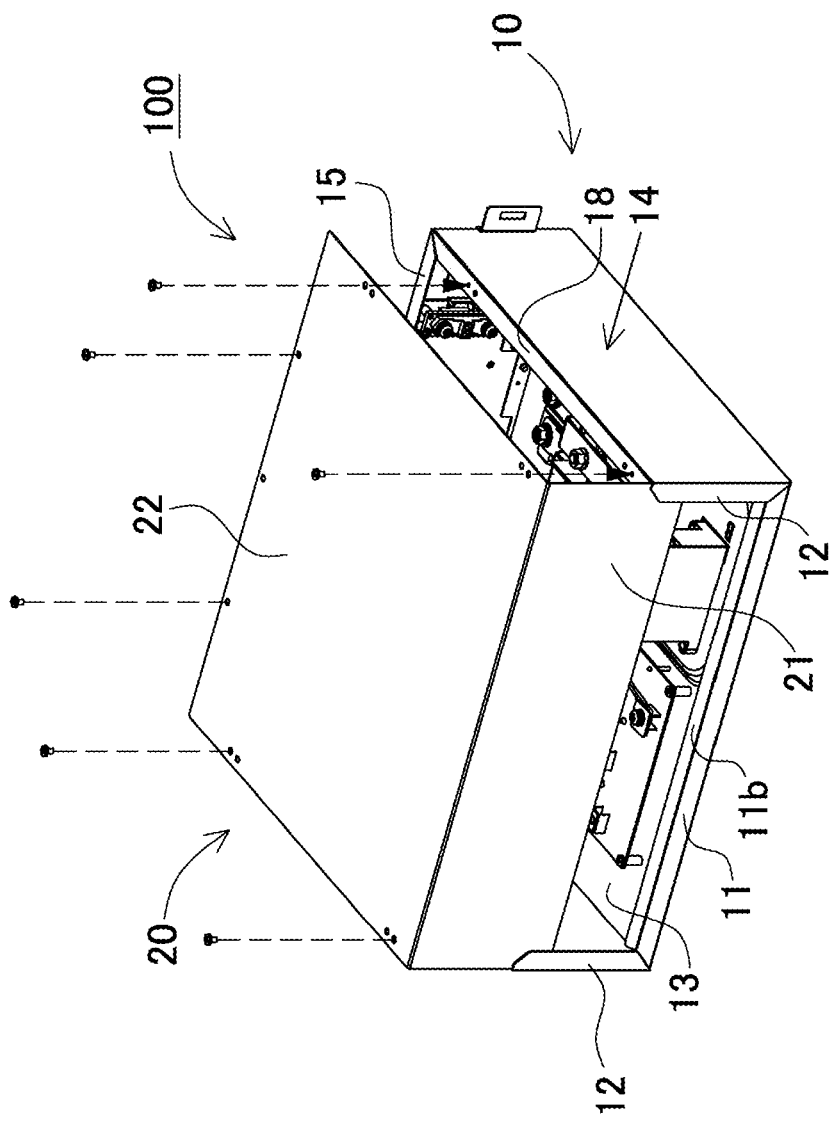
FIG. 3 is a perspective view of the electronic control device for showing inserting a front plate of a cover shown in FIG. 2 into gaps of a body case.

Electronic control device case 100 according to Exemplary Embodiment 1 of the present invention is shown in FIGS. 1 to 3. FIG. 1 is a perspective view of electronic control device case 100 according to Embodiment 1 of the present invention. FIG. 2 is an exploded perspective view of electronic control device case 100 shown in FIG. 1 including an enlarged view of a main portion thereof. FIG. 3 is a perspective view of electronic control device case 100 showing inserting front plate 21 of cover 20 shown in FIG. 2 into first gaps D1 of body case 10. Electronic control device case 100 shown in these figures includes body case 10 and cover 20.

Body Case 10

Body case 10 has a front opening opened at least in a forward direction. Body case 10 includes bottom plate 13 and a pair of side walls bent at and extended from both ends of bottom plate 13, respectively. Upper ends of the pair of side walls 14 are bent to form fifth flanges 18, respectively.

Body case 10 further includes back plate 15 closing a back opening demarcated by a back end of bottom plate 13 and back ends of the pair of side walls 14. Body case 10 is formed by bending metal plates, such as cold rolled steel plates.

Cover 20

Cover 20 includes front plate 21 closing the front opening of body case 10. In the example shown in FIGS. 1 to 3, cover 20 further includes top plate 22 formed unitarily with front plate 21. Top plate 22 and front plate 21 are formed by bending metal plates. Cover 20 may be preferably made of the same metal as body case 10. Top plate 22 closes an upper opening of body case 10 demarcated by upper ends of the pair of side walls 14 and an upper end of back plate 15. Top plate 22 of cover 20 is fixed to fifth flanges 18 with screws through screw holes opening in fifth flanges 18.

First Flange 11, Second Flange 12

Body case 10 further includes first flange 11 and second flanges 12. First flange 11 is bent at the front end of bottom plate 13. Second flanges 12 are bent at respective front ends of the pair of side walls 14. First flange 11 does not overlap second flanges 12 when viewed from front as shown in FIG. 2. More specifically, first flange 11 has an oblique surface at each of both side ends thereof close to a corresponding one of second flanges 12. Each of second flanges 12 has an oblique surface at a lower end thereof close to first flange 11. Each of the oblique surfaces of the first flange 11 and second flanges 12 inclines at an angle of 45°. Widths of first flange 11 and second flanges 12 extended from their respective bent portions are identical to one another.

Figure 4:
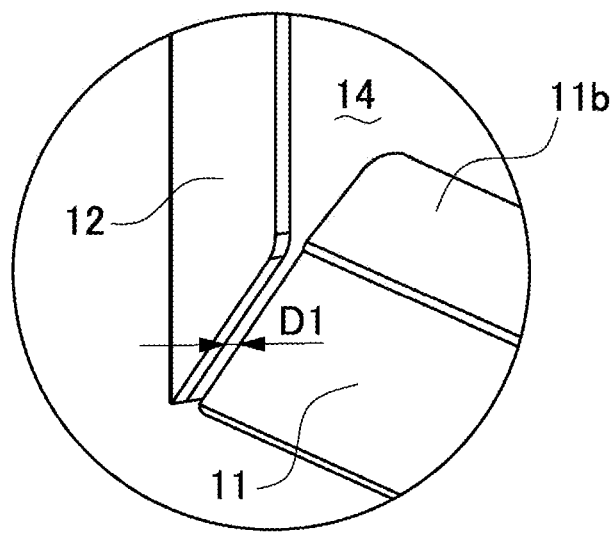
FIG. 4 is an enlarged perspective view of a portion of the electronic control device indicated by a broken line on the left side of the body case shown in FIG. 2.
Figure 5:
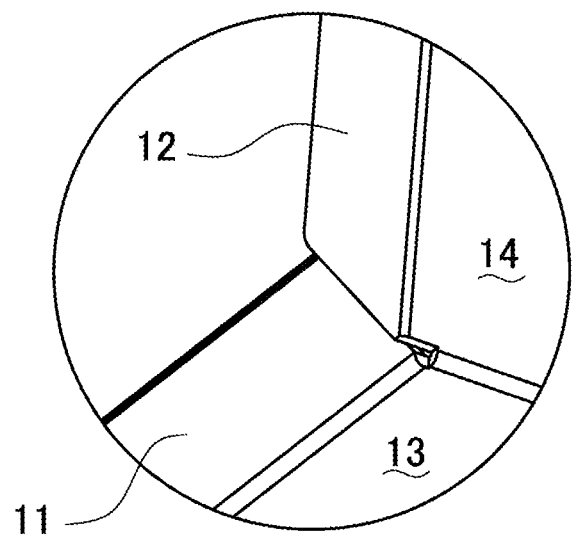
FIG. 5 is an enlarged perspective view of a portion of the electronic control device indicated by a broken line on the right side of the body case shown in FIG. 2 viewed from an obliquely downward direction.
Figure 6:
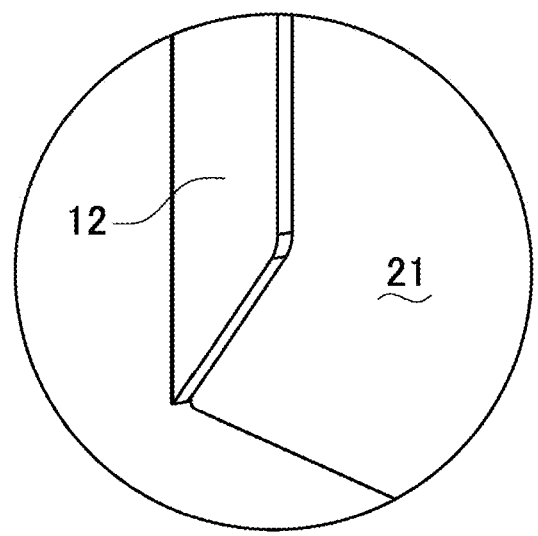
FIG. 6 is an enlarged perspective view of a portion of the electronic control device indicated by a broken line on the left side of the electronic control device case shown in FIG. 1.
Figure 7:
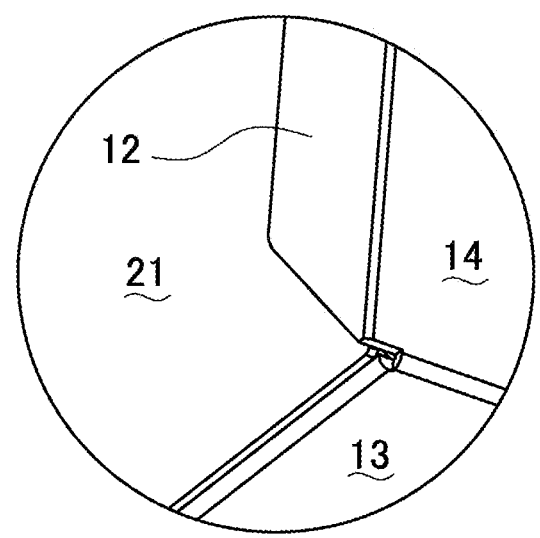
FIG. 7 is an enlarged perspective view of a portion of the electronic control device indicated by a broken line on the right side of the electronic control device case shown in FIG. 1 viewed from an obliquely downward direction.
Figure 8:
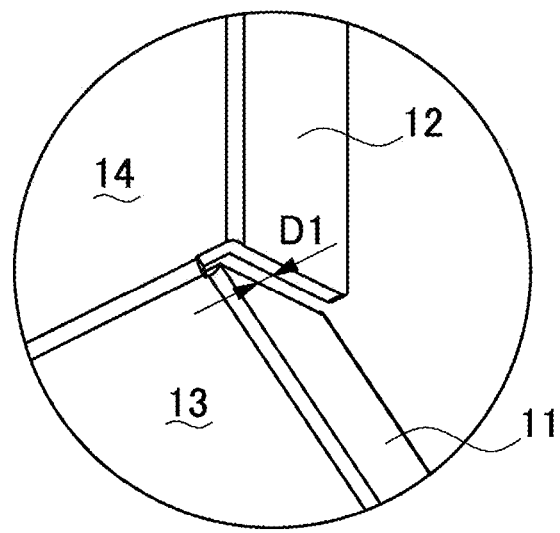
FIG. 8 is an enlarged perspective view of a portion of the electronic control device indicated by a broken line on the left side of the electronic control device case shown in FIG. 1 viewed from an obliquely downward direction.
Figure 9:
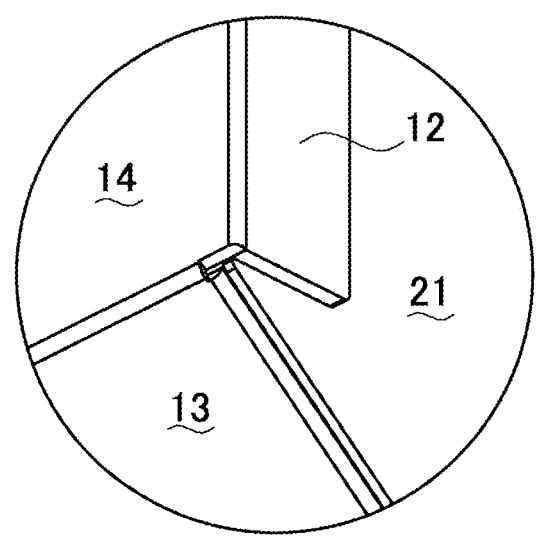
FIG. 9 is an enlarged perspective view of a portion of the electronic control device indicated by a broken line on the left side of the electronic control device case shown in FIG. 2 viewed from an obliquely downward direction.
Figure 10:
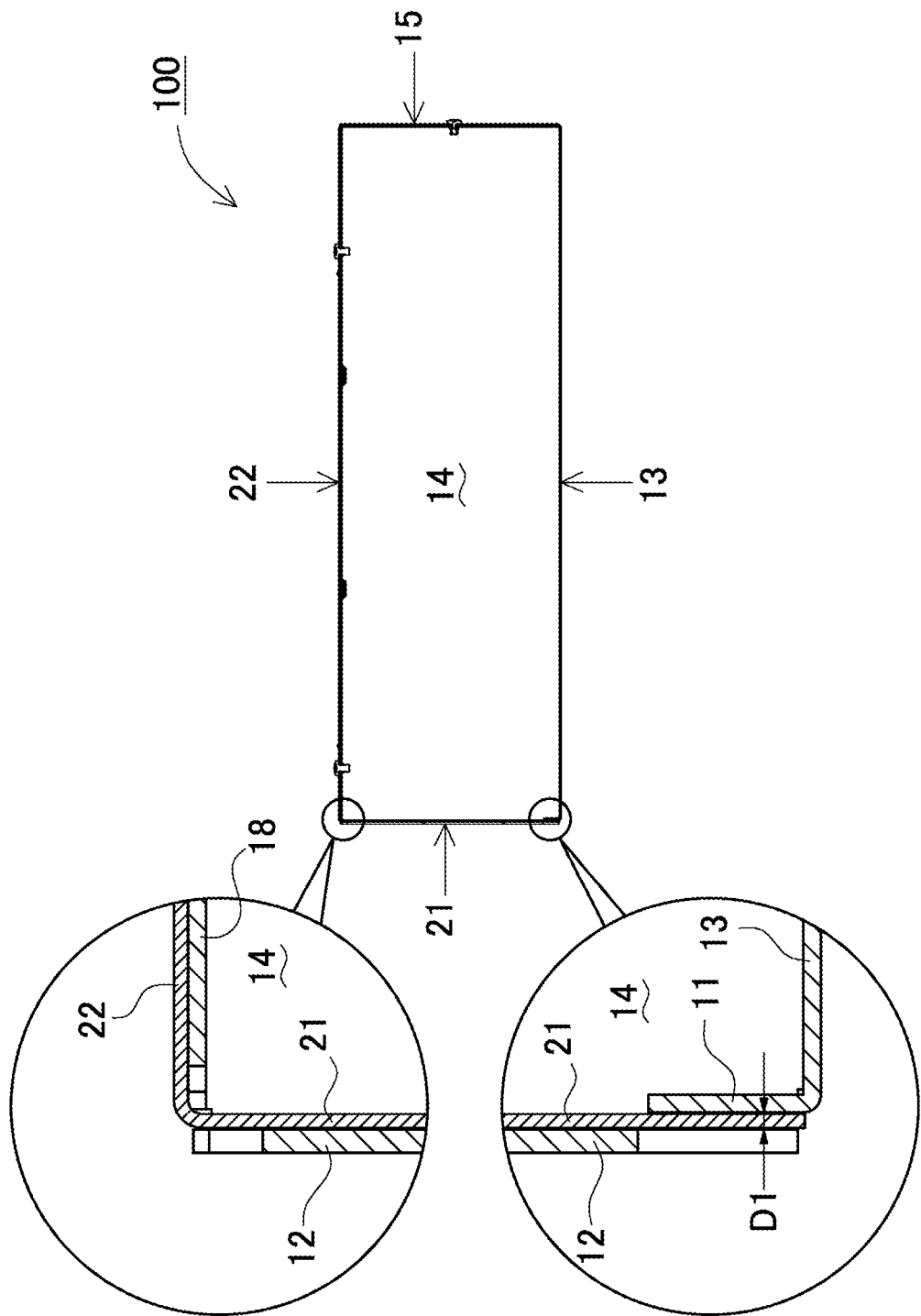
FIG. 10 is a cross sectional view of the electronic control device along a line X-X shown in FIG. 1.
Figure 11:
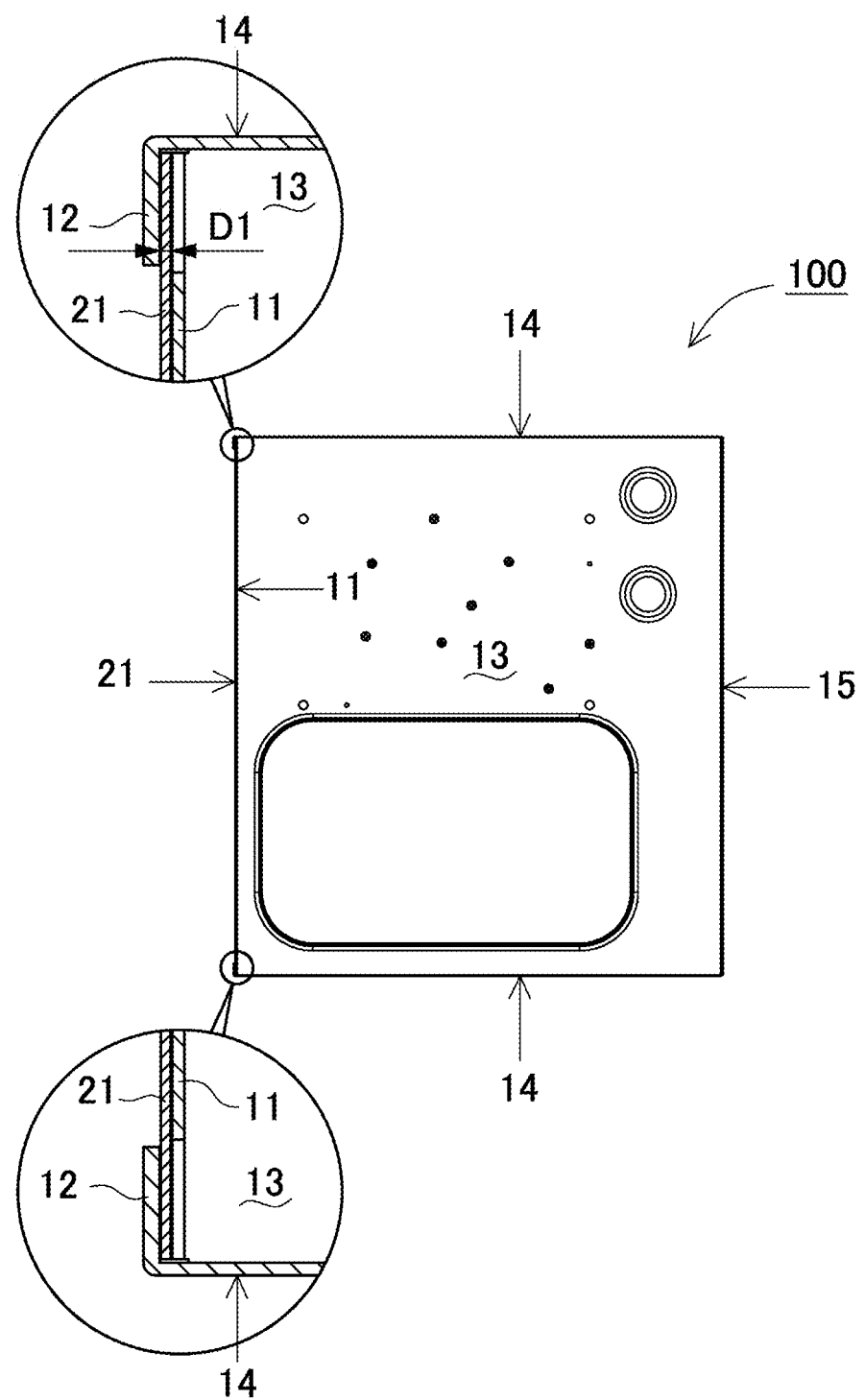
FIG. 11 is a cross sectional view of the electronic control device along a line XI-XI shown in FIG. 1.
Figure 12:
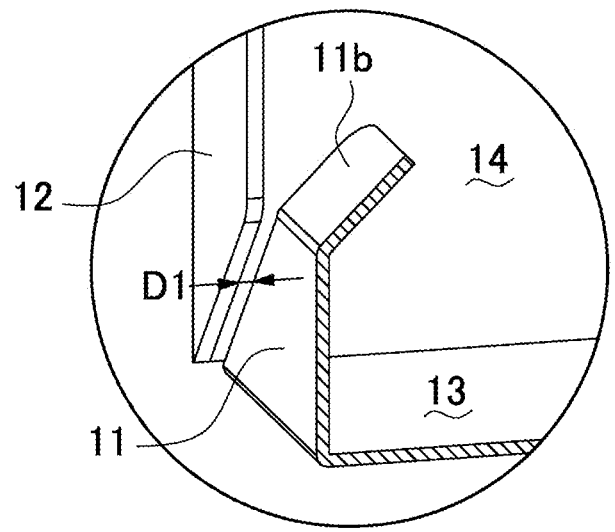
FIG. 12 is a cross sectional view of the electronic control device along a line XII-XII shown in FIG. 1 viewed from an inside.
Figure 13:
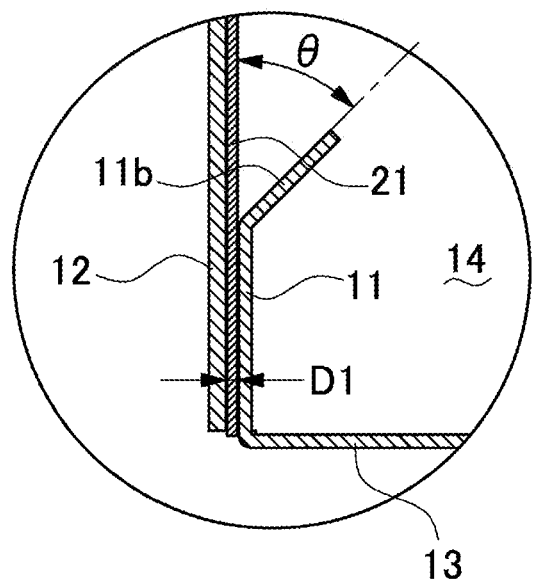
FIG. 13 is an end view of the electronic control device along a line XIII-XIII shown in FIG. 1.

Front plate 21 of cover 20 is sandwiched between first flange 11 and each of second flange 12 such that front plate 21 closes the front opening of body case 10. More specifically, first gap D1 is provided between first flange 11 and each of second flanges 12 as shown in enlarged perspective views of main portions of the device shown in FIG. 2. Front plate 21 is inserted or pushed into first gaps D1 as shown in FIG. 3 to close the front opening. Therefore, first flange 11 and each second flange 12 are not located on the same plane. FIGS. 4 to 13 show positional relations of first flange 11, second flanges 12 and front plate 21. FIG. 4 is an enlarged perspective view of a portion of body case 10 indicated by a broken line on the left side of body case 10 shown in FIG. 2. FIG. 5 is an enlarged perspective view of a portion of body case 10 indicated by a broken line on the right side of body case 10 shown in FIG. 2 viewed from an obliquely downward direction. FIG. 6 is an enlarged perspective view of a portion of electronic control device case 100 indicated by a broken line on the left side of electronic control device case 100 shown in FIG. 1. FIG. 7 is an enlarged perspective view of a portion of electronic control device case 100 indicated by a broken line on the right side of electronic control device case 100 shown in FIG. 1 viewed from an obliquely downward direction. FIG. 8 is an enlarged perspective view of a portion of electronic control device case 100 indicated by a broken line on the left side of electronic control device case 100 shown in FIG. 1 viewed from an obliquely downward direction. FIG. 9 is an enlarged perspective view of a portion of electronic control device case 100 indicated by a broken line on the left side of electronic control device case 100 shown in FIG. 2 viewed from an obliquely downward direction. FIG. 10 is a cross sectional view of electronic control device case 100 along a line X-X shown in FIG. 1. FIG. 11 is a cross sectional view of electronic control device case 100 along a line XI-XI shown in FIG. 1. FIG. 12 is a cross sectional view of electronic control device case 100 along a line XII-XII shown in FIG. 1 viewed from an inside. FIG. 13 shows an end of electronic control device case 100 along a line XIII-XIII shown in FIG. 1.

Second flanges 12 are positioned on a second plane which is different from a first plane on which first flange 11 is positioned. The second plane on which second flanges 12 are positioned is located outer than the first plane as shown in, for example, FIGS. 4, 5, 8, 10 and 11. The back surface of front plate 21 at the lower edge thereof is pushed by first flange 11 as shown, for example, in FIG. 11. The front surfaces of front plate 21 at both side edges thereof are respectively pushed by second flanges 12 as shown in, for example, FIG. 10. In this structure, the end of front plate 21 of cover 20 is sandwiched and held between first flange 11 and each of second flanges 12.

Figure 16:
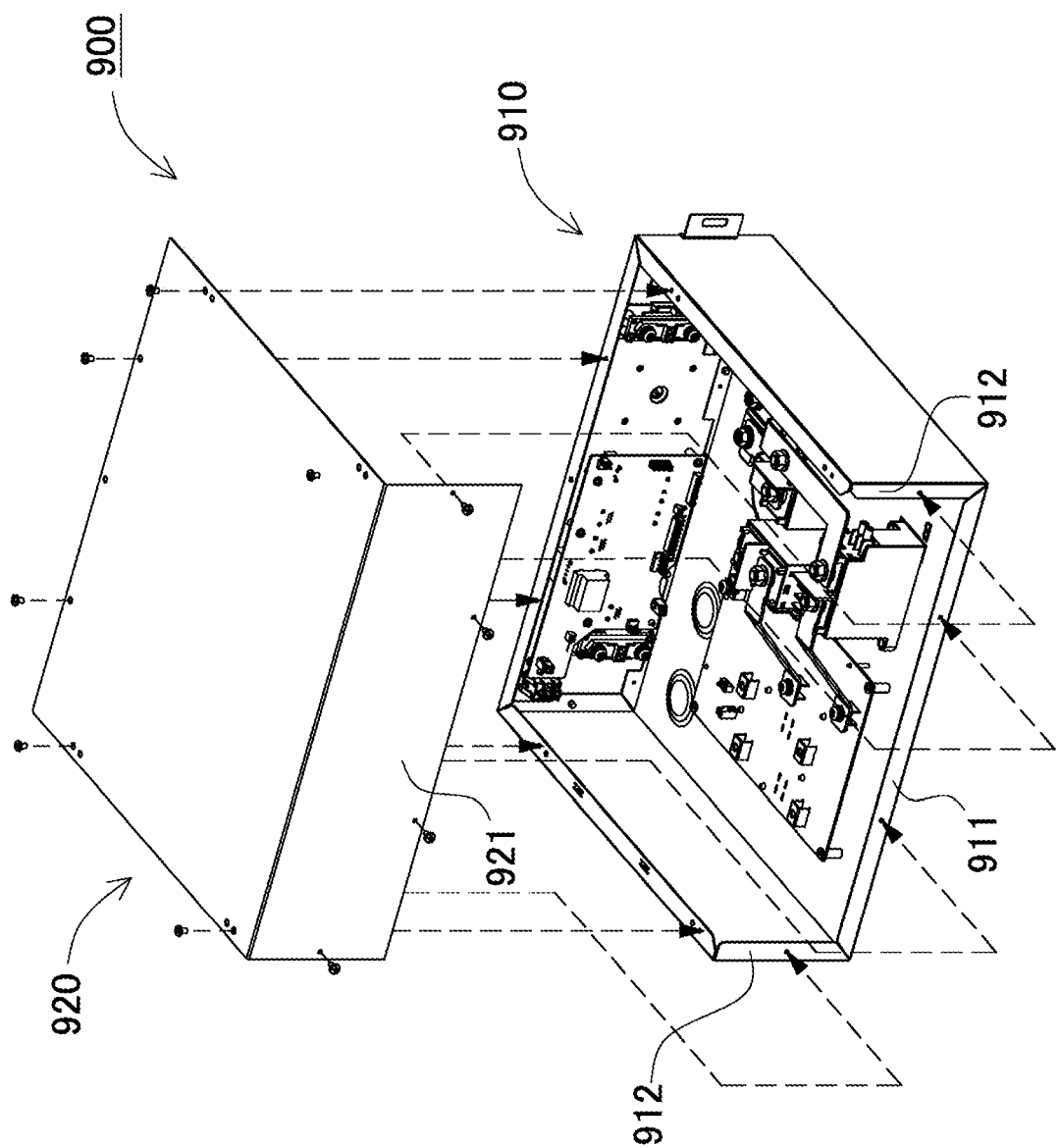
FIG. 16 is an exploded perspective view of a conventional electronic control device case.
Figure 17:
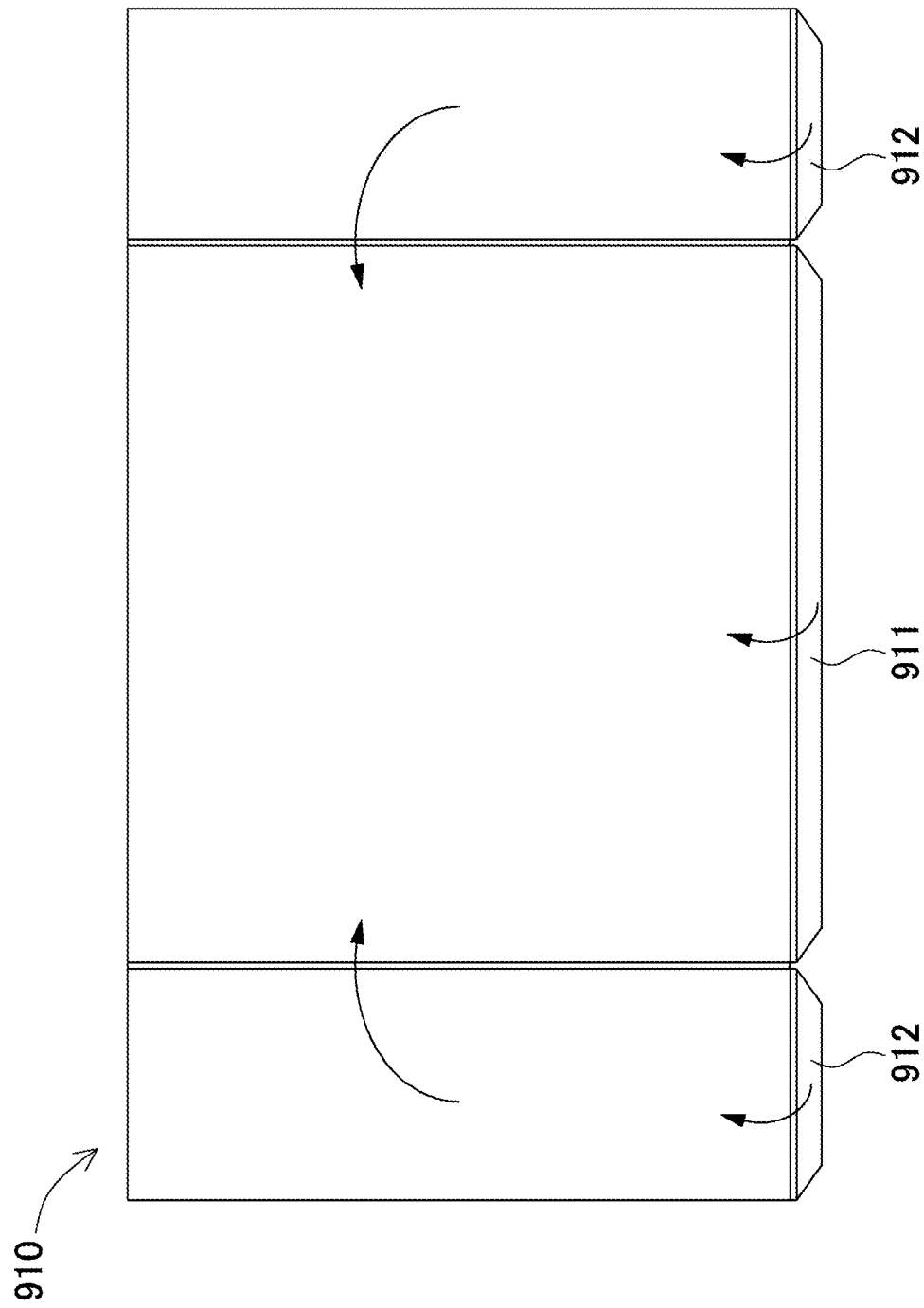
FIG. 17 is a development view of a lower case shown in FIG. 16.

In the conventional electronic control device case 900 shown in FIG. 16, first flange 911 and second flanges 912 are positioned on the same plane, and front plate 921 is fixed to first flange 911 and second flanges 912 with screws. To produce electronic control device case 900 having this structure, body case 910 is made of a metal plate as shown in a development view of FIG. 17, and ends of the metal plate are bent at 90° to form first flange 911 and second flanges 912. When a metal plate is bent by a metal plate processing in this manner, a spring back occurs. Therefore, it is necessary to bend the metal plate at more than 90°, causing an edge of first flange 911 and edges of second flanges 912 to interfere with each other.

Figure 18:
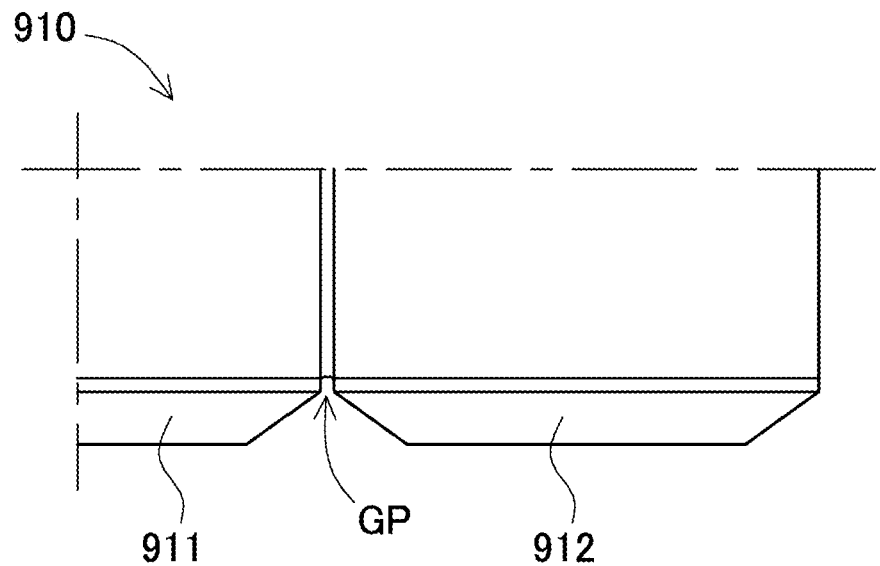
FIG. 18 is an enlarged view of a main portion of the lower case shown in FIG. 17.
Figure 19:
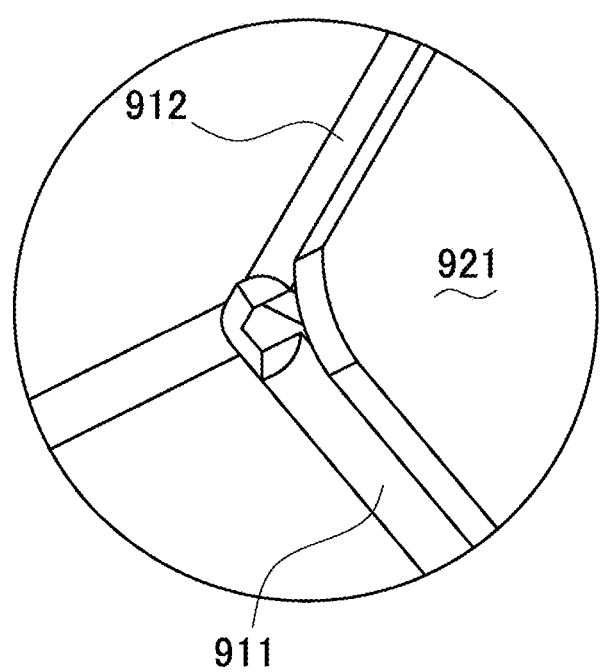
FIG. 19 is an enlarged perspective view of the electronic control device case shown in FIG. 16.

To solve this problem, it is necessary to form gaps GP at borders of first flange 911 and second flanges 912 as shown in a development view of FIG. 18 so that the first flange and each second flange do not interfere with each other during the bending process. As a result, relatively large gaps remained at corners of electronic control device case 900 after the bending process as shown in FIG. 19. Accordingly, it is necessary to fill the gaps with a resin or a cushion to prevent foreign matters from entering through the corners of electronic control device case 900 into the inside of the case.

In electronic control device case 100 according to the present embodiment, on the other hand, first flange 11 and each of second flanges 12, which are formed by bending the metal plate, are positioned on planes different from each other, hence avoiding mutual interference of the first flange and each second flange during the process of bending the metal plate at more than 90°. This configuration does not require large gaps for avoiding the interference and to reduce the works of preparing and arranging members to fill the gaps. The opening areas of the gaps are relatively large in the conventional electronic control device case 900 as shown in, for example, FIG. 19. At the corresponding portions in electronic control device case 100 according to the present embodiment, on the other hand, each gap is extremely reduced to be a narrow slit, accordingly preventing entry of foreign matters effectively.

In addition, first gap D1 between first flange 11 and each of second flanges 12 may be designed to be equal to or narrower than the thickness of front plate 21, so that front plate 21 can be fixed by being pushed into first gaps D1. This configuration may eliminate works for fixing first flange 11 and second flanges 12 with screws or the like. Particularly, in the case of fixing with screws, since a screwdriver contacts a screw from the front plate 921 side as shown in FIG. 16, an adequate space is necessary around the electronic control device case. Such an adequate space may be hardly prepared around the electronic control device case depending on the environment in which the electronic control device case is placed. Even in this case, electronic control device case 100 according to the present embodiment allows cover 20 to be fixed with a screw from top plate 22 side as shown in FIG. 3, thus providing a high accessibility during the works for detaching and attaching cover 20. Further, the cover of the conventional electronic control device case is required to be fixed with screws from both the upper plate and the side walls as shown in FIG. 16. On the other hand, cover 20 of electronic control device case 100 according to the present embodiment may be fixed with a screw only from top plate 22, thus simplifying works to only the works performed from the upper direction, and accordingly enhancing workability of assembly. In addition, front plate 21 may not necessarily have holes, such as screw holes to pass screws. Further, none of first flange 11 and second flanges 12 necessarily have holes therein to pass screws. This configuration reduces the cost of machining the metal plate. Further, omission of the holes and cutouts for screws enhances the strength of first flange 11 and second flanges 12. This increases the stiffness and stability of the case by increasing the areas of the flanges contacting front plate 21 for pressing or crimping.

First flange 11 is bent in a direction away from front plate 21 at its end from which the lower edge of front plate 21 is inserted, thereby providing bent piece 11b as shown in, for example, FIGS. 4 and 5. The end of first flange 11 which is thus bent constitutes an insertion guide to first gap D1 between first flange 11 and each of second flanges 12 as shown in the perspective view of FIG. 12. Accordingly, convenience for the work of assembling electronic control device case 100 can be improved. As shown in FIG. 13, bent angle θ of bent piece 11b may be determined arbitrarily, for example, ranging from 5° to 45°.

Figure 14:
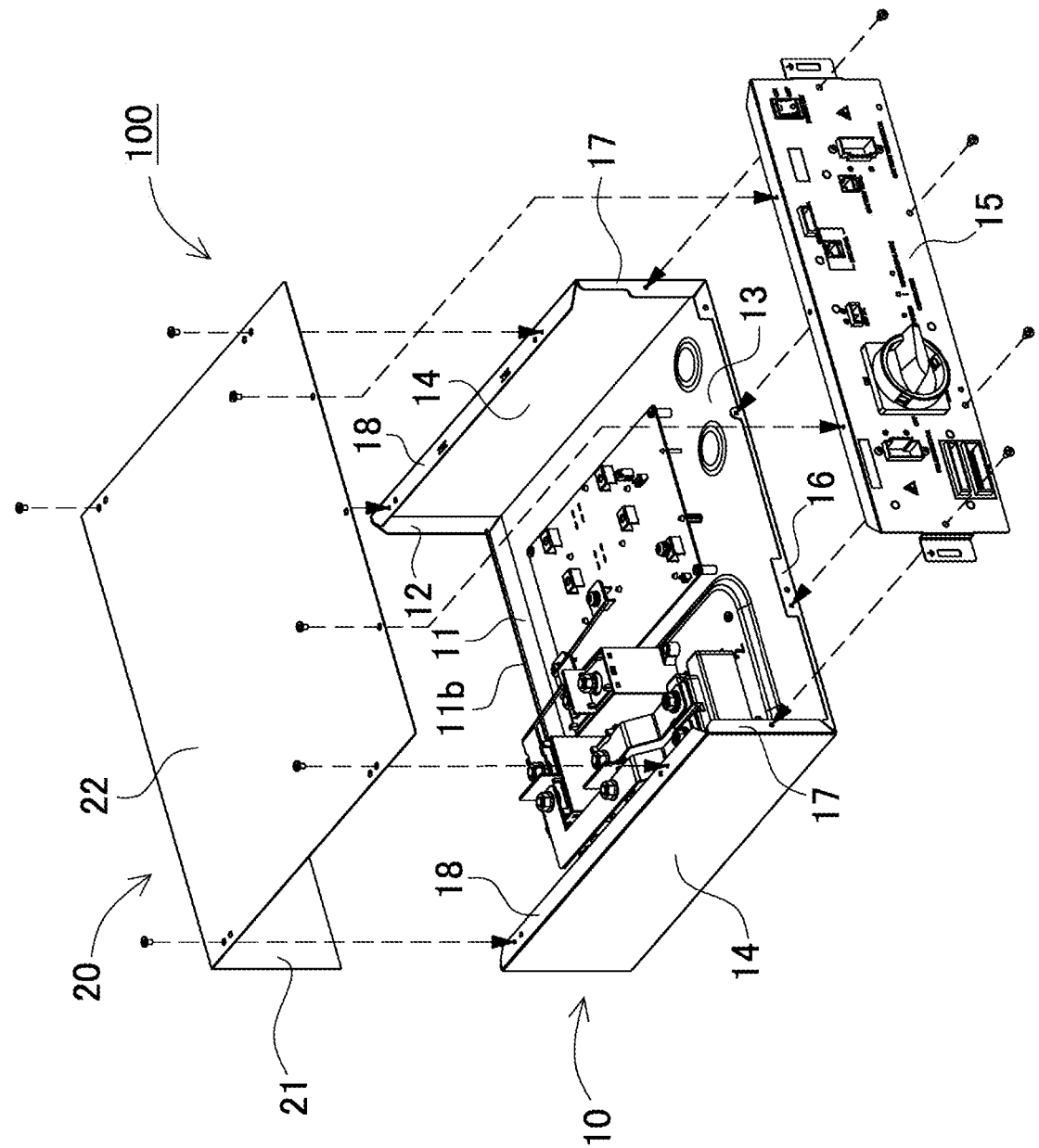
FIG. 14 is an exploded perspective view of the electronic control device case shown in FIG. 1 viewed from a back side.

FIG. 14 is an exploded perspective view of electronic control device case 100 according to Embodiment 1 viewed from back. As shown in FIG. 14, back plate 15 of body case 10 is made of a separate member. The back ends of body case 10 are bent to form third flange 16 at the back end of bottom plate 13 and to form fourth flanges 17 at the respective back ends of side walls 14. Back plate 15 is fixed to bottom plate 13 and side walls 14 through third flange 16 and fourth flanges 17.

In the example shown in FIG. 14, third flange 16 and fourth flanges 17 are positioned on the same plane. Back plate 15 is fixed with screws through screw holes provided in first flange 16 and fourth flanges 17.

Exemplary Embodiment 2

As described above, in electronic control device case 100 according to Embodiment 1, first flange 11 and second flanges 12 at the front side are not positioned on the same plane, but are disposed to provide first gaps D1 between first flange 11 and each of second flanges 12 so that front plate 21 may be sandwiched between first flange 11 and each of second flanges 12. On the other hand, third flange 16 and fourth flanges 17 are positioned on the same plane so that back plate 15 may be fixed with screws to third flange 16 and fourth flanges 17. However, the present invention is not limited to such configuration, and back plate 15 may be fixed by being sandwiched between third flange 16 and each of fourth flanges 17. An example of such configuration is shown in an exploded perspective view of FIG. 15 as electronic control device case 200 according to Exemplary Embodiment 2. In electronic control device case 200 shown in FIG. 15, components identical to those of electronic control device case 100 according to Embodiment 1 are denoted by the same reference numerals, and their detailed explanation will be omitted.

Figure 15:
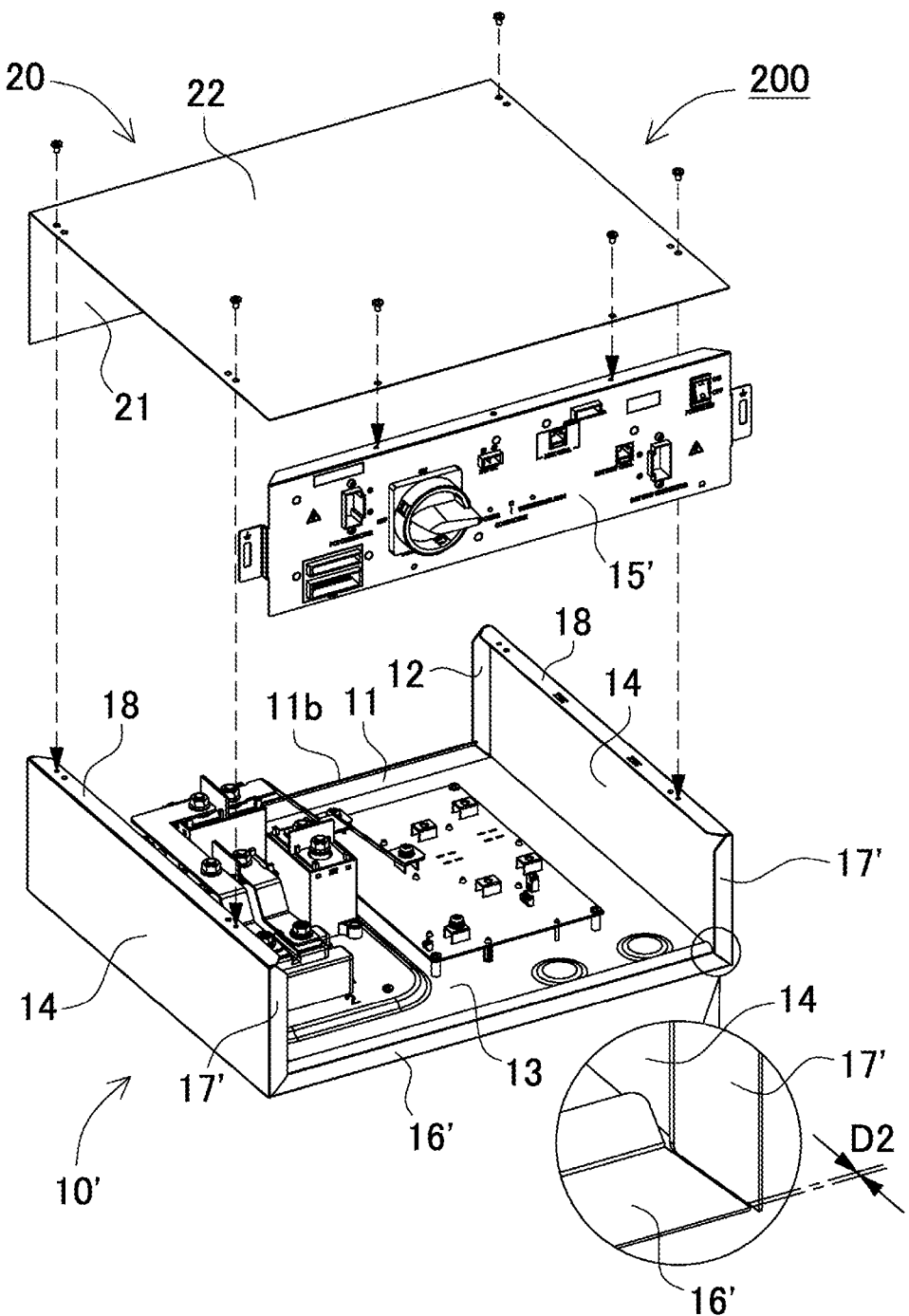
FIG. 15 is an exploded perspective view of an electronic control device case according to Exemplary Embodiment 2 including an enlarged view of a main portion thereof viewed from a back side.

Fourth flanges 17' are positioned on a fourth plane different from a third plane on which third flange 16' is positioned as shown in the enlarged view of the main part in FIG. 15. In order to determine the bending positions of third flange 16' and fourth flanges 17' on the development view and to bend third flange 16' and fourth flanges 17', the bending positions are previously designed such that third flange 16' and each fourth flange 17' are positioned on planes different from each other. The height difference between third flange 16' and each fourth flange 17', or second gap D2, is substantially equal to the thickness of back plate 15'. Particularly, second gap D2 may be equal to or slightly narrower than the thickness of back plate 15'. This configuration design allows, during assembling electronic control device case 200, to push back plate 15' into each of second gaps D2 to fix back plate 15' to body case 10' by a fitting structure without screws. Back plate 15' may be preferably made of a metal plate made of the same material as front plate 21, and second gap D2 may preferably have the same width as first gap D1 to simplify the determining.

In each of the above-described exemplary embodiments, the back plate may be made of a separate member from the body case or may be made by bending the back end of the bottom plate of the body case.

INDUSTRIAL APPLICABILITY

An electronic control device case according to the present invention is usable as a case for a backup electronic control device that can be equipped in a power module of a computer server. Also, the electronic control device case according to the present invention can be appropriately used as a case for a backup power supply device for a wireless base station of the mobile phones or the like. Also, the electronic control device case according to the present invention can be appropriately used as a case for a home-use storage battery, an industrial-use storage battery, a power source for the street light, an electric storage device combined with the solar cells, a backup power source for the traffic signals, or a power source for an electric vehicle such, for example, as a plug-in hybrid electric automobile each switchable between an EV driving mode and an HEV driving mode, a hybrid electric automobile, and any of other electric automobiles.

REFERENCE MARKS IN THE DRAWINGS 100, 200, 900 electronic control device case
10, 10', 910 body case
11, 911 first flange
11b bent piece
12, 912 second flange
13 bottom plate
14 side wall
15, 15' back plate
16, 16' third flange
17, 17' fourth flange
18 fifth flange
20, 920 cover
21, 921 front plate
22 top plate
D1 first gap
D2 second gap
GP gap

The invention claimed is:

1. An electronic control device case comprising:
a body case including a bottom plate and a pair of side walls which are bent at both ends of the bottom plate and extend from the both ends of the bottom plate, respectively, the body case having a front opening; and
a cover including a front plate closing the front opening of the body case, wherein
the body case further includes a first flange bent and second flanges, the first flange being bent at a front end of the bottom plate, the second flanges being bent at respective front ends of the pair of side walls,
an outer face of the first flange is positioned on a first plane, and inner faces of the second flanges are positioned on a second plane different from the first plane,
the outer face of the first flange pushes a lower end of a back surface of the front plate of the cover in a direction away the body case, and
the inner faces of the second flanges push both side ends of a front surface of the front plate of the cover toward the body case,
the first flange has oblique surfaces at both side edges thereof close to the second flanges, and each of the second flanges has an oblique surface at a lower edge of the each of the second flanges close to the first flange, and
the first flange bends inward over a top portion of the first flange.

2. The electronic control device case of claim 1, wherein the second plane on which the second flanges are positioned is located outer than the first plane.

3. The electronic control device case of claim 1, wherein each of the oblique surface of the first flange and the oblique surfaces of the second flanges incline at an angle of 45°.

4. The electronic control device case of claim 1, wherein the first flange does not overlap the second flanges when viewed from front.

5. The electronic control device case of claim 1, wherein the first flange is bent at the lower end of the front plate in a direction away from the front plate.

6. The electronic control device case of claim 1, wherein the first flange and the second flanges have a same width.

7. The electronic control device case of claim 1, wherein
the body case further includes a back plate closing a back opening demarcated by a back end of the bottom plate and respective back ends of the pair of side walls, and
the cover further includes a top plate bent at an upper end of the front plate and extending from the upper end of the front plate such that the top plate closes an upper opening demarcated by respective upper ends of the pair of side walls and an upper end of the back plate of the body case.

8. The electronic control device case of claim 1, wherein the front plate has no opening for screwing.

9. The electronic control device case of claim 1, wherein the body case and the cover are made of metal plates.

10. The electronic control device case of claim 1, wherein the electronic control device case accommodates therein a control circuit for a power source device including a plurality of secondary battery cells.

* * * * *